United States Patent
Lu et al.

(10) Patent No.: US 9,466,501 B2
(45) Date of Patent: *Oct. 11, 2016

(54) METHOD AND APPARATUS FOR IMPROVING CMP PLANARITY

(71) Applicant: TAIWAN SEMICONDUCTOR MANUFACTURING COMPANY, LTD., Hsin-Chu (TW)

(72) Inventors: Hsin-Hsien Lu, Hsinchu (TW); Chang-Sheng Lin, Baoshan Township (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/477,932

(22) Filed: Sep. 5, 2014

(65) Prior Publication Data

US 2014/0377954 A1   Dec. 25, 2014

Related U.S. Application Data

(63) Continuation of application No. 13/790,031, filed on Mar. 8, 2013, now Pat. No. 8,828,875.

(51) Int. Cl.
  *H01L 21/306* (2006.01)
  *H01L 21/321* (2006.01)
  *H01L 21/768* (2006.01)
  *H01L 21/3105* (2006.01)

(52) U.S. Cl.
  CPC ... *H01L 21/30625* (2013.01); *H01L 21/31055* (2013.01); *H01L 21/3212* (2013.01); *H01L 21/7684* (2013.01); *H01L 21/31053* (2013.01); *H01L 21/31058* (2013.01)

(58) Field of Classification Search
  CPC ............. C09G 1/02; H01L 21/30625; H01L 21/3212; H01L 21/7684
  See application file for complete search history.

(56) References Cited

U.S. PATENT DOCUMENTS

| | | |
|---|---|---|
| 5,514,245 A | 5/1996 | Doan et al. |
| 5,516,729 A | 5/1996 | Dawson et al. |
| 6,083,838 A | 7/2000 | Burton et al. |
| 6,616,514 B1 | 9/2003 | Edelbach et al. |

(Continued)

FOREIGN PATENT DOCUMENTS

| | | |
|---|---|---|
| TW | 409297 | 10/2000 |
| TW | 569330 | 1/2004 |

*Primary Examiner* — Duy Deo
(74) *Attorney, Agent, or Firm* — Haynes and Boone, LLP

(57) ABSTRACT

Provided is a method of planarizing a semiconductor device. A dielectric layer is formed over a substrate. A plurality of openings is formed in the dielectric layer. The openings have varying distribution densities. The openings are filled with a metal material. A first chemical-mechanical-polishing (CMP) process is performed to remove portions of the metal material over the dielectric layer. Thereafter, a sacrificial layer is formed over the dielectric layer and the metal material. The sacrificial layer has a planar surface. The sacrificial layer is formed through one of: a spin-on process or a flowable chemical vapor deposition (FCVD) process. A second CMP process is then performed to remove the sacrificial layer and portions of the dielectric layer and the metal material therebelow. The second CMP process uses a slurry configured to have a substantially similar polishing selectivity between the sacrificial layer, the dielectric layer, and the metal material.

20 Claims, 5 Drawing Sheets

(56) References Cited

U.S. PATENT DOCUMENTS

| | | | |
|---|---|---|---|
| 7,955,964 B2 * | 6/2011 | Wu | H01L 21/76883 438/587 |
| 8,367,534 B2 | 2/2013 | Chen et al. | |
| 8,828,875 B1 * | 9/2014 | Lu et al. | 438/690 |
| 2004/0266183 A1 * | 12/2004 | Miller et al. | 438/687 |
| 2011/0171824 A1 * | 7/2011 | Isono | 438/624 |

* cited by examiner

METHOD AND APPARATUS FOR IMPROVING CMP PLANARITY

PRIORITY DATA

The present application is a continuation application of U.S. patent application Ser. No. 13/790,031, filed on Mar. 8, 2013, now U.S. Pat. No. 8,828,875 issued Sep. 9, 2014, the disclosure of which is hereby incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs. In the course of integrated circuit evolution, functional density (i.e., the number of interconnected devices per chip area) has generally increased while geometry size (i.e., the smallest component that can be created using a fabrication process) has decreased. This scaling down process generally provides benefits by increasing production efficiency and lowering associated costs.

As semiconductor device sizes continue to shrink, it has become increasingly more difficult to meet device planarization requirements in fabrication. For example, in conventional semiconductor fabrication, a two-step chemical-mechanical-polishing (CMP) process may be performed on a semiconductor wafer during certain stages of fabrication. However, the traditional two-step CMP process is not able to achieve satisfactory planarity performance. In other words, the wafer surface after the CMP process may still exhibit larger-than-desired topography variations. The non-planarity issue may be exacerbated for newer generation technology nodes such as the 15 nanometer (nm) technology node and beyond.

Therefore, while existing semiconductor device planarization methods have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

As semiconductor device sizes continue to shrink, it has become increasingly more difficult to meet device planarization requirements in fabrication. For example, the formation of an interconnect structure—which includes metal lines and vias that interconnect metal lines from different layers—of IC devices generally requires a planarization step. Traditionally, the planarization step may yield unsatisfactory results due to factors such as dishing effects. Consequently, the wafer surface may not achieve a good planarity even after being planarized. This may lead to device yield issues or failures.

According to various aspects of the present disclosure, an improved planarization method is disclosed, which allows the wafer surface to achieve a better planarity.

To illustrate, FIGS. 1 to 4 are diagrammatic fragmentary cross-sectional side views of a portion of a semiconductor device 30 at various fabrication stages according to various aspects of the present disclosure. The semiconductor device 30 may be a portion of a semiconductor wafer for example. It is understood that FIGS. 1 to 4 have been simplified for a better understanding of the inventive concepts of the present disclosure.

Figure 1:
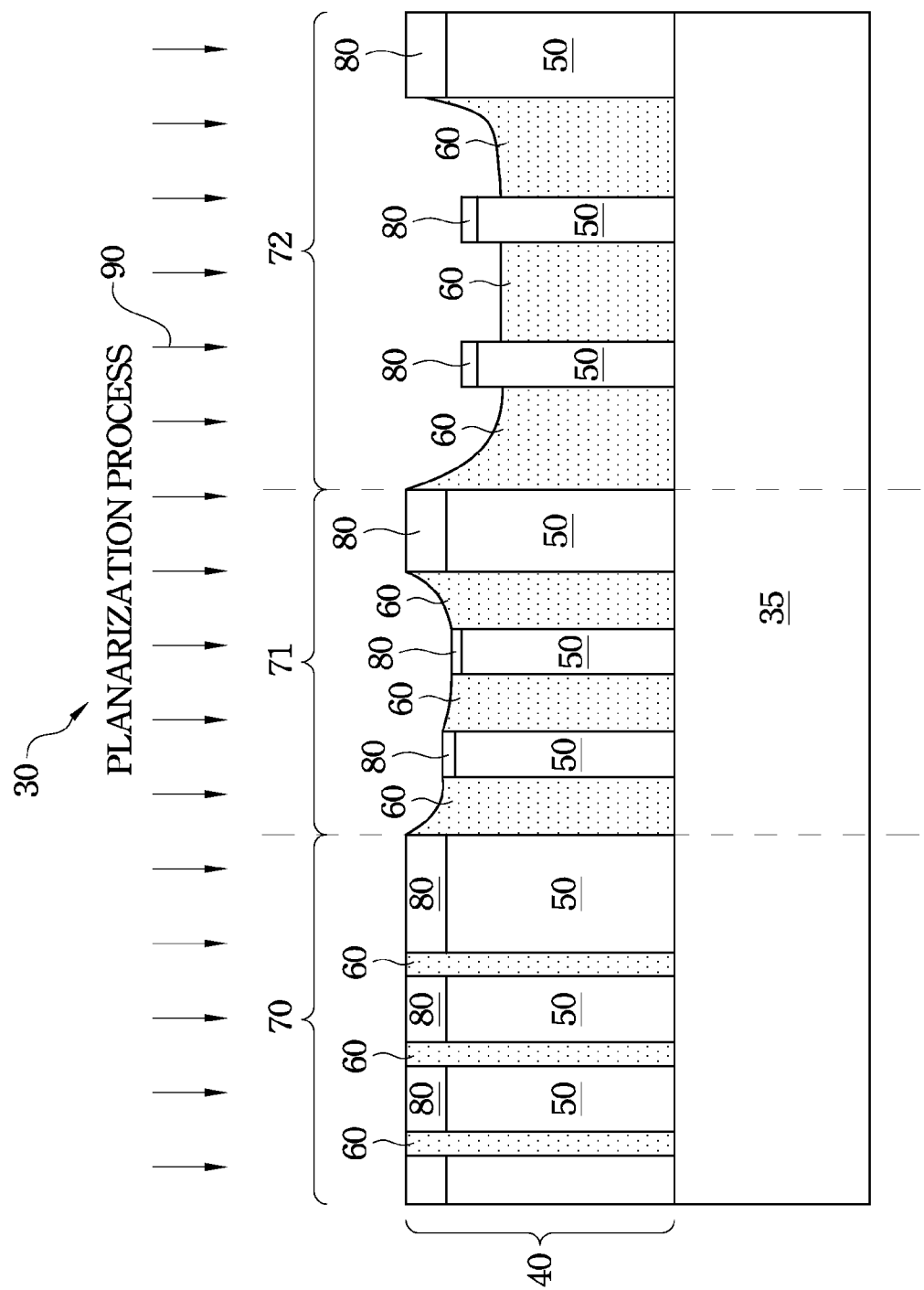
FIGS. 1-4 are diagrammatic fragmentary cross-sectional side views of a semiconductor device at various stages of fabrication according to various aspects of the present disclosure.
Figure 2:
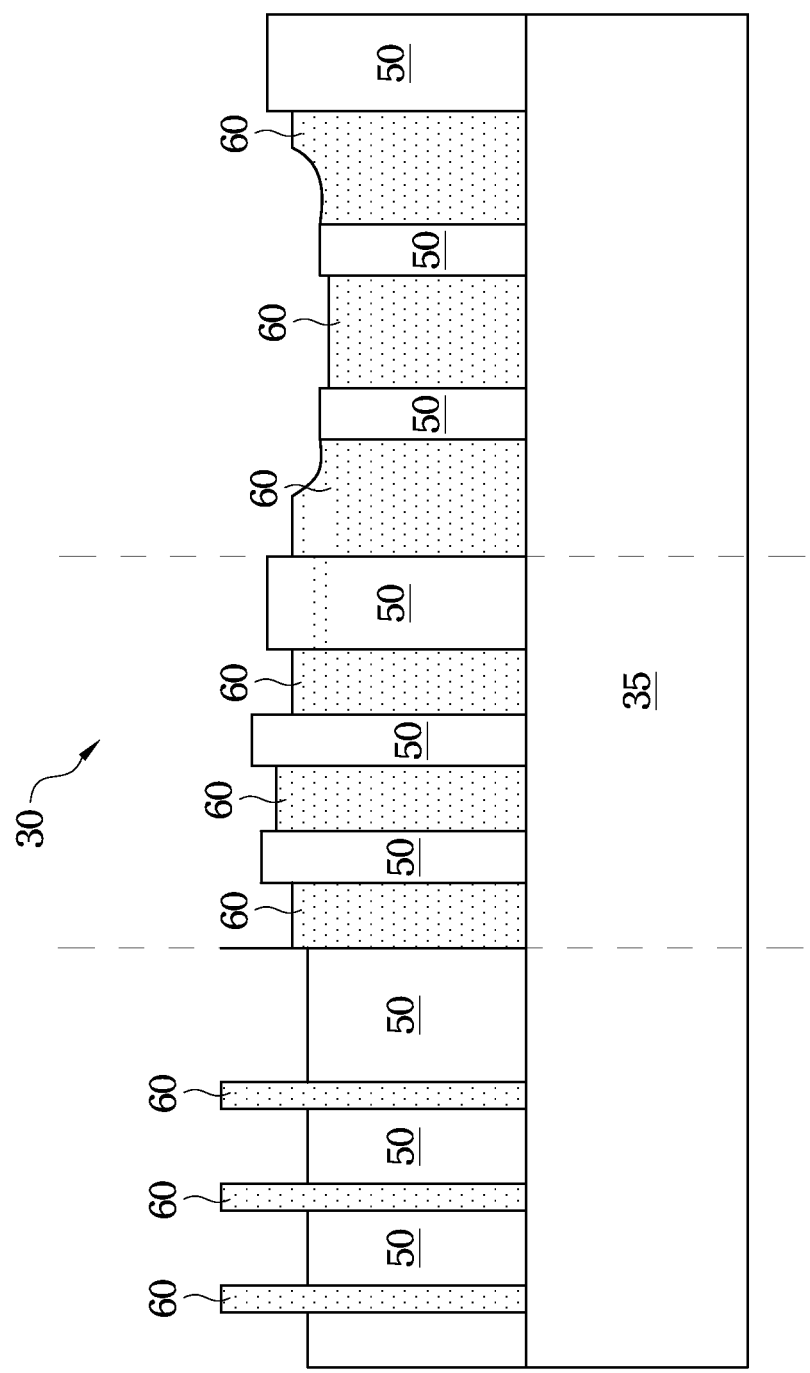

Referring to FIG. 1, the semiconductor device 30 includes a substrate 35. The substrate 35 is a silicon substrate doped with either a P-type dopant such as boron, or doped with an N-type dopant such as phosphorous or arsenic. The substrate 35 may alternatively include other elementary semiconductors such as germanium and diamond. The substrate 35 may optionally include a compound semiconductor and/or an alloy semiconductor. Further, the substrate 35 may include an epitaxial layer (epi layer), may be strained for performance enhancement, and may include a silicon-on-insulator (SOI) structure.

An interconnect structure 40 is formed over the substrate 35. For reasons of simplicity, FIG. 1 may only illustrate a part of the interconnect structure 40, and any intermediate layers between the illustrated portion of the interconnect structure 40 and the substrate 35 are omitted. The interconnect structure 40 is configured to provide electrical connections between microelectronic components of the semiconductor device 30 (for example, transistor devices) and external devices.

The interconnect structure 40 includes a dielectric material, also referred to as an interlayer dielectric (ILD) layer 50. The ILD layer 50 may include dielectric materials such as oxide, nitride, a low-k dielectric material, or another suitable material.

The interconnect structure 40 further includes a conductive elements 60. The conductive elements 60 include a plurality of metal components that are electrically isolated from each other by the ILD layer 50. In the illustrated embodiment, the conductive elements 60 contains copper (Cu), but it is understood that the conductive elements 60 may contain other suitable metal materials in alternative embodiments. The conductive elements 60 may be formed by etching a plurality of openings in the ILD layer 50, and thereafter filling the openings with a conductive material (e.g., copper) through a suitable deposition process.

The semiconductor device 30 includes various portions (or regions) with different pattern densities. Pattern density refers to the number of semiconductor features that are disposed within a given region of a wafer. For two wafer regions that are the same in size, one of these regions has a higher pattern density if more semiconductor features are packed into that region than the other region. In the illustrated embodiment, the pattern density is with respect to the density (or distribution) of the conductive elements 60 in each region. In other words, a region of the semiconductor device 30 with a high concentration of the conductive elements 60 will have a greater pattern density, and vice versa, a region of the semiconductor device 30 with a lower concentration of the conductive elements 60 will have a smaller pattern density.

For the sake of providing an example, regions 70, 71, and 72 of the semiconductor 30 are shown in FIG. 1. These regions 70-72 are separated by imaginary dashed lines in FIG. 1. It can be seen that the region 70 has the lowest pattern density (i.e., the lowest concentration of the conductive elements 60) among the regions 70-72, the region 71 has an intermediate pattern density among the regions 70-72 (i.e., a medium concentration of the conductive elements 60), and the region 72 has the greatest pattern density (i.e., the highest concentration of the conductive elements 60) among the regions 70-72. The region 70 may also be referred to as an "iso" region, and the region 72 may also be referred to as a "dense" region. It is understood that in other embodiments, the regions 70-72 may include other types of devices with varying pattern densities.

In the illustrated embodiment, a patterned hard mask layer 80 is disposed over the ILD layer 50. In some embodiments, the hard mask layer 80 may contain a titanium nitride (TiN) material or a tantalum nitride (TaN) material. The hard mask layer 80 may be used to etch opening or trenches into the ILD layer, where the openings are subsequently filled to become the conductive elements 60. The portions of the conductive elements 60 disposed over the hard mask layer 80 are then polished away in a planarization process 90. The planarization process 90 may include a chemical-mechanical-polishing (CMP) process, for example. The portions of the conductive elements disposed over the hard mask layer 80 may be quite thick, for example a few thousand angstroms (Å) (e.g., between about 2000 angstroms to about 800 angstroms). Thus, the planarization process 90 may also be referred to as a bulk CMP process. The planarization process 90 may be configured to have a removal rate (RR) of a few thousand angstroms-per-minute (e.g., between about 3000 angstroms-per-minute to about 5000 angstroms-per-minute) for the conductive material 60 to be removed, which in the present embodiment is copper. The hard mask layer 80 may also serve as a polishing-stop layer for the planarization process 90. The hard mask layer 80 may be relatively thin, for example having a thickness less than about 10 angstroms.

The goal of the planarization process 90 is to produce a substantially flat surface for the semiconductor device 30. However, due to the variation in pattern densities, a dishing effect causes the exposed surface of the semiconductor device 30 to be non-planar, as shown in FIG. 1. For example, the region 70 (having the lowest pattern density) may achieve a somewhat flat surface, but the region 71 (having an intermediate pattern density) may exhibit a concave cross-sectional profile after the planarization process 90, and the region 72 (having the greatest pattern density) may have an even more concave cross-sectional profile than the region 71. Therefore, the surface of the semiconductor device 30 may not be sufficiently planarized, and efforts need to be made to address this issue. According to some techniques, a subsequent planarization process is then performed to the semiconductor device 30, where a polishing selectivity of the second planarization process is tuned so that the conductive elements 60 are removed at a slower rate. However, these techniques often over or under compensate in terms of adjusting polishing selectivity, and the result is a wafer surface that is still not sufficiently planarized even after the second planarization process, such as the one shown in FIG. 2. The lack of planarity even after the performance of the second planarization process may still cause problems in semiconductor fabrication, especially as device sizes become increasingly small.

To overcome these non-planarity issues discussed above, the present disclosure utilizes a sacrificial layer to create a substantially flat surface. Thereafter, a planarization process is performed, where the planarization is tuned to have a substantially uniform polishing selectivity so as to preserve the flat profile of the surface. These steps are discussed in more detail below with reference to FIGS. 3-4, which are cross-sectional views of the semiconductor device 30 at stages of fabrication after the fabrication stage shown in FIG. 1.

Figure 3:
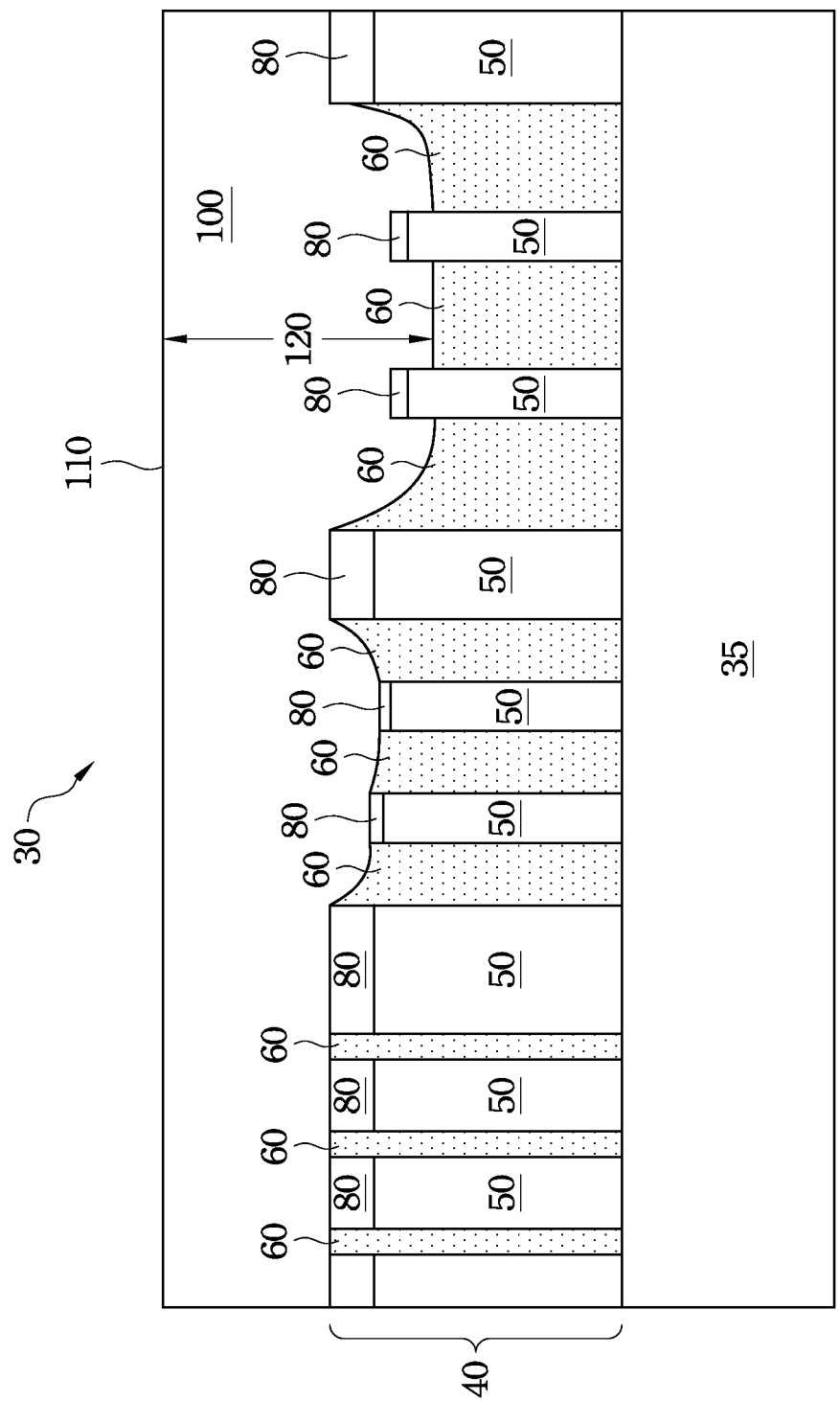

Referring to FIG. 3, a sacrificial layer 100 is formed over the exposed surface of the semiconductor device 30. In some embodiments, the sacrificial layer 100 includes a material that can be formed via a spin-on process. For example, the material may include spin-on glass, such as $SiO_2$ or SiOF. As another example, the material may include organic polymer, such as polyimide or F-doped polyimide. As yet another example, the material may include SiOCH, $Si_xO_yC_zH_w$, or a suitable carbon-doped silicon oxide. The chemical formulas for some of these candidate spin-on materials are provided below:

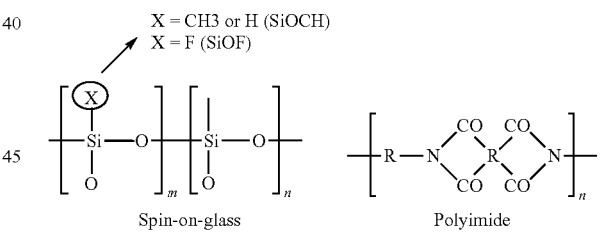

Spin-on-glass       Polyimide

In certain embodiments, the spin-on material is spun onto the surface of the semiconductor device 30 using a spin-on tool. The spin-on material may then be baked by baking process where the baking temperature is in a range from about 100 degrees Celsius to about 300 degrees Celsius. Thereafter, the spin-on material may be cured in a furnace at a curing temperature in a range from about 350 degrees Celsius to about 450 degrees Celsius.

In other embodiments, the sacrificial layer 100 may include a material that can be formed via a flowable chemical vapor deposition (FCVD) process. For example, the material for the sacrificial layer 100 may include undoped silicate glass (USG). As another example, the material for the sacrificial layer 100 may include phosphosilicate glass (PSG). As yet another example, the material for the sacrificial layer 100 may include borophosphosilicate glass (BPSG). In certain embodiments, the FCVD process involves applying a thermal reflow with a processing temperature of between about 700 degrees Celsius and about 1000 degrees Celsius, and a processing time of between about 0.5 hour to about 2 hours.

Regardless of the specific method used in its formation, the sacrificial layer 100 is formed to have a substantially flat or planarized surface. For example, an upper (or exposed) surface 110 of the sacrificial layer 100 may have a thickness variation of less than about 80 angstroms across its entire surface, for example less than about 10 angstroms. Meanwhile, an overall thickness 120 of the sacrificial layer 100 may be in a range from about 500 angstroms to about 1000 angstroms. It is understood that the spin-on method or FCVD method of forming a flat/planar surface 110 for the sacrificial layer 100 are merely examples. In other embodiments, different methods and/or materials may be employed to form a sacrificial layer 100 having a flat surface 110.

Figure 4:
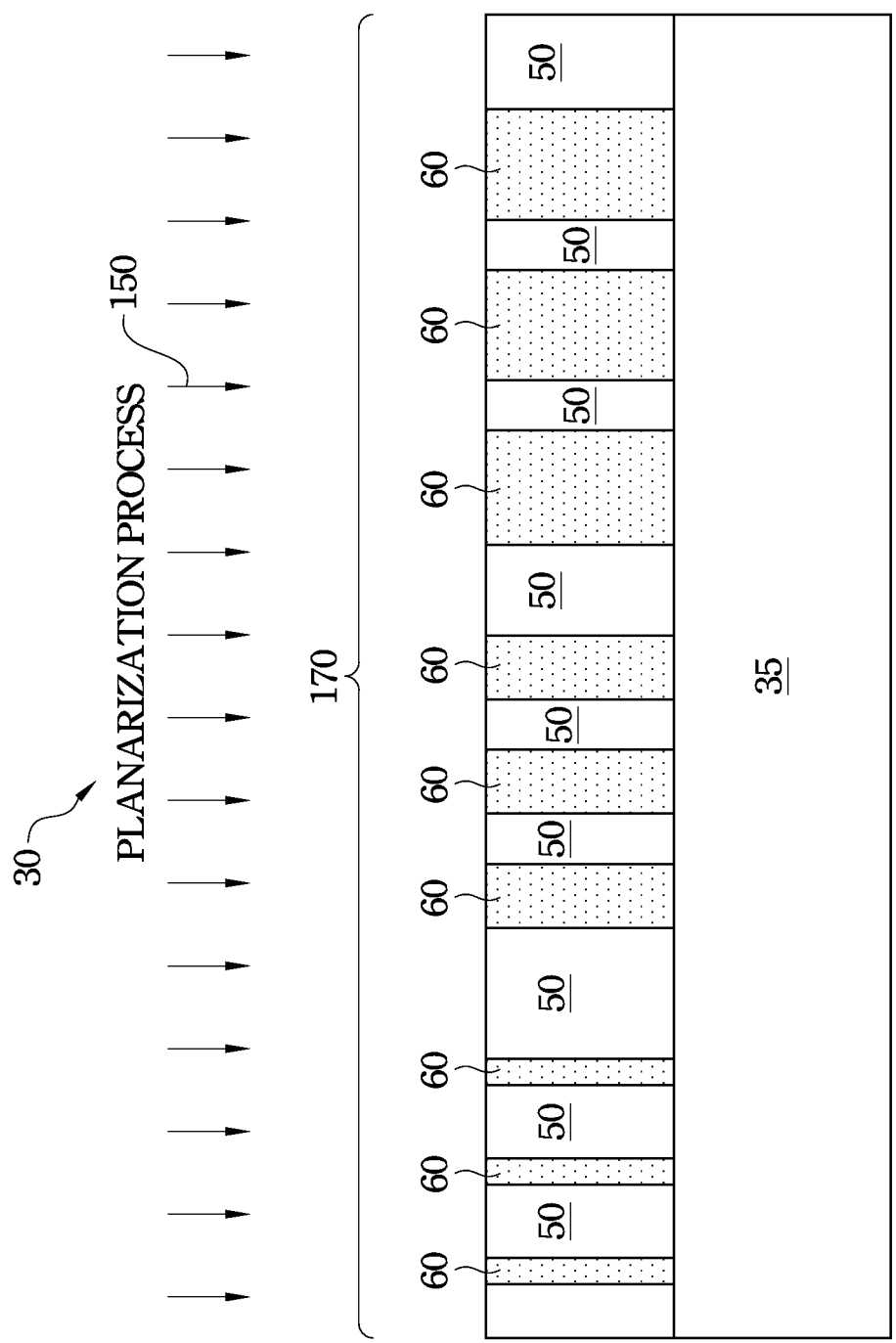

Referring now to FIG. 4, a planarization process 150 is performed to the semiconductor device 30. In some embodiments, the planarization process 150 includes a CMP process. In addition to using a polishing pad to polish the semiconductor device 30, the CMP process also utilizes a slurry to help etch away the materials of the semiconductor device 30, including the sacrificial layer 100, the hard mask layer 80, the conductive elements 60, and the ILD layer 50. In some embodiments, a removal rate (RR) of the planarization process 150 is in a range from about 300 angstroms-per-minute to about 1000 angstroms-per-minute.

According to the various aspects of the present disclosure, the slurry of the CMP process is configured to have a substantially uniform polishing selectivity with respect to all the materials being polished/removed. In other words, the slurry is tuned such that the etching rate will be substantially the same for the sacrificial layer 100, the hard mask layer 80, the conductive elements 60, as well as the ILD layer 50. For example, in some embodiments, the etching rates for the sacrificial layer 100, the hard mask layer 80, the conductive elements 60, and the ILD layer 50 are within a few percentage points (or even less than 1 percentage point) of each other.

As a result of the substantially uniform polishing selectivity, the semiconductor device 30 after the planarization process 150 has a substantially flat surface 170, similar to the substantially flat surface 110 of the sacrificial layer 100 (FIG. 3). Stated differently, the surface 170 preserves the surface planarity of the sacrificial layer 100 at least in part as a result of the CMP slurry having the uniform polishing selectivity. In some embodiments, the surface 170 has a planarity with less than about 80 angstroms of thickness variation across the entire surface 170, for example less than about 10 angstroms. As such, the present disclosure can achieve a sufficiently planar surface for the semiconductor device 30 despite the semiconductor device having multiple regions with varying pattern densities.

In order to achieve the substantially uniform polishing selectivity for the CMP slurry, the material composition of the slurry is carefully configured. According to the various aspects of the present disclosure, the slurry includes at least the following contents: water ($H_2O$), hydrogen peroxide ($H_2O_2$), an abrasive material, and certain additives. A majority of the slurry is made up by the water. The rest may be made up by the hydrogen peroxide, the abrasive material, and the additives. In some embodiments, the water may have a concentration of greater than about 80% of the slurry, and the hydrogen peroxide may have a concentration between about 0% to about 5% of the slurry.

In some embodiments, the abrasive material may have a concentration between about 3% to about 15% of the slurry.

The suitable candidates for the abrasive material may include silicon dioxide ($SiO_2$), aluminum oxide ($Al_2O_3$), and cerium oxide ($CeO_2$), or combinations thereof.

In some embodiments, the additives may include: a copper corrosion inhibitor, a copper chelator, a low-k rate suppressor, and a pH buffer, or combinations thereof. As examples, the copper corrosion inhibitor may have a concentration of between about 0 to 1000 parts-per-million (ppm). The suitable candidates for the copper corrosion inhibitor may include benzotriazole (BTA), cysteine, with N: electron pair (a nitrogen atom with three bondings and one pair of non-bonding electrons), or combinations thereof. The table below shows the chemical formulas for some example copper corrosion inhibitors:

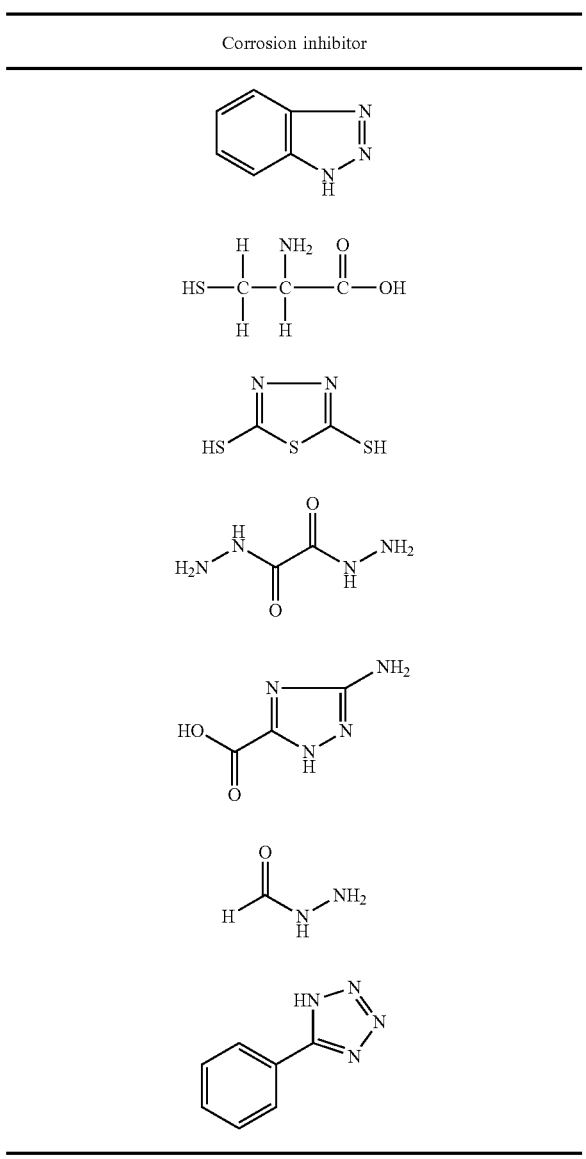

In some embodiments, the copper chelator may have a concentration between about 0% to about 1% of the slurry. The suitable candidates for the copper chelator may include: organic acid, —COOH:ethylenediaminetetraacetic (EDTA), tartaric acid, or combinations thereof. The chemical formula for an example copper chelator is shown below:

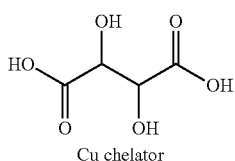

Cu chelator

In some embodiments, the low-k rate suppressor may have a concentration between about 0 to about 100 ppm. The suitable candidates for the low-k suppressor may include: with —OH bond, polyethylene glycol (PEG), polyethyleneoxide (PEO), cellulose, or combinations thereof. Shown below are example chemical formulas for the PEG and the cellulose:

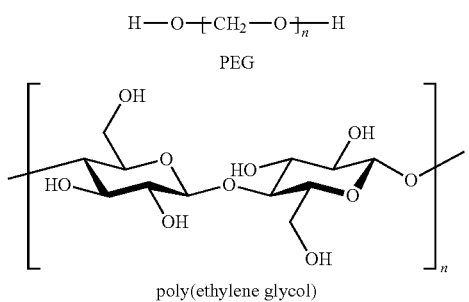

poly(ethylene glycol)

In some embodiments, the pH buffer may have a concentration between about 0% to about 2% of the slurry. The suitable candidates for the pH buffer may include: potassium hydroxide (KOH), ammonium hydroxide ($NH_4OH$), sulfuric acid ($H_2SO_4$), nitric acid ($HNO_3$), or combinations thereof. An overall pH value of the slurry may be tuned to vary in a range from about 2.0 to about 11.0.

It is also understood that additional processes may be performed to complete the fabrication of the semiconductor device 30. For example, The wafers containing the semiconductor device 30 may also undergo passivation, slicing, and packaging processes.

Figure 5:
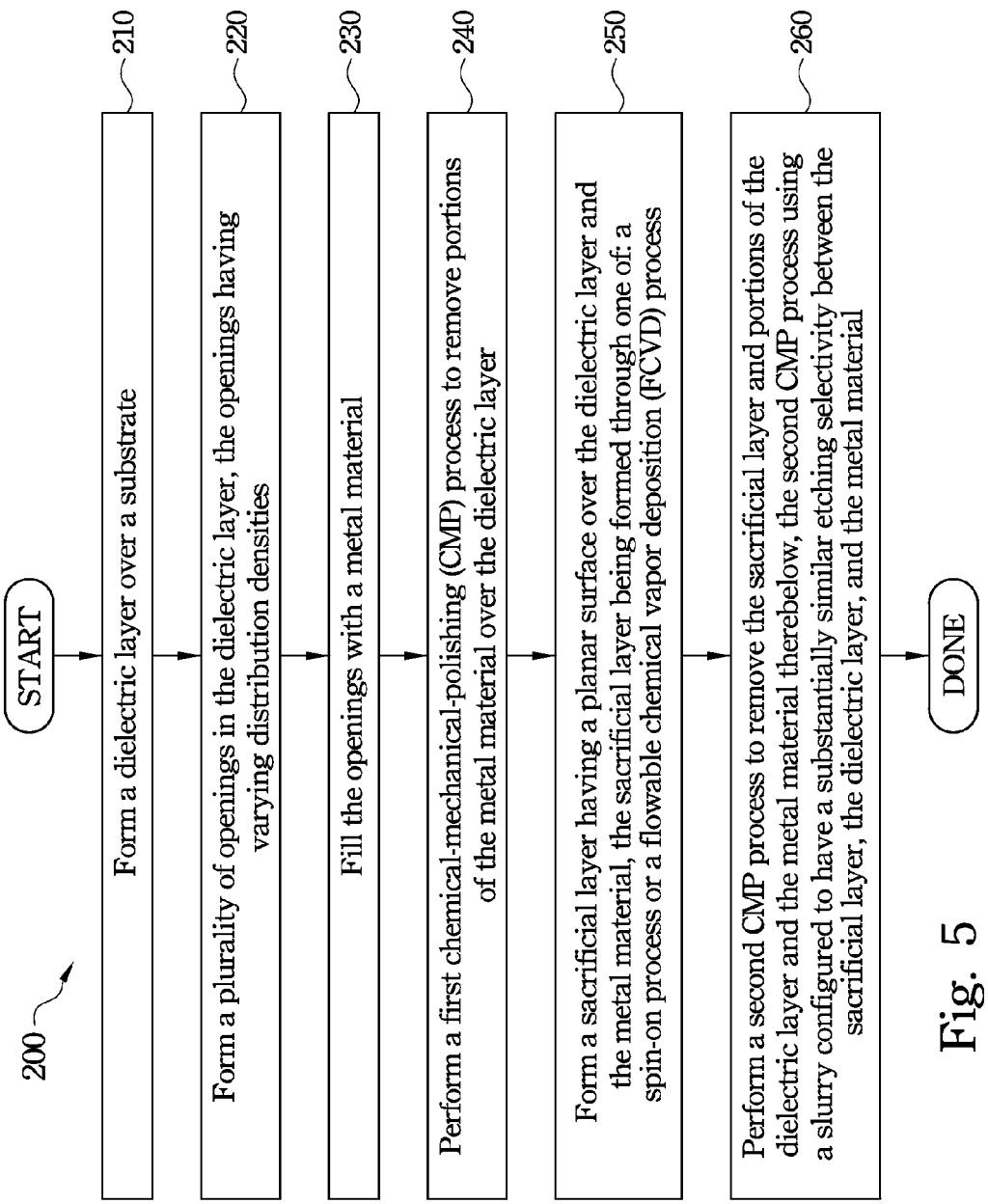
FIG. 5 is a flowchart illustrating a method for planarizing a semiconductor device according to various aspects of the present disclosure.

FIG. 5 is a flowchart of a method 200 of fabricating a semiconductor device according to various aspects of the present disclosure. The method 200 includes a step 210, in which a dielectric layer is formed over a substrate. The dielectric layer may be an interlayer dielectric (ILD) and may contain an oxide material or a low-k material.

The method 200 includes a step 220, in which a plurality of openings is formed in the dielectric layer. The openings have varying distribution densities. In other words, a greater number of openings may be formed in some portions of the dielectric layer, and a smaller number of openings may be formed in other portions of the dielectric layer.

The method 200 includes a step 230, in which the openings are filled with a metal material. The metal material may be formed in a suitable deposition process. The metal material may contain copper in some embodiments. Because the openings have varying distribution densities, the metal elements filling the openings are distributed unevenly throughout the dielectric layer. Therefore, the semiconductor device has non-uniform pattern densities.

The method 200 includes a step 240, in which a first CMP process is performed to remove portions of the metal material over the dielectric layer. Stated differently, the portions of the metal material are removed outside the openings. Due at least in part to the non-uniform pattern densities, the surface of the semiconductor device still has an uneven or non-flat surface even after the first CMP process is performed.

The method 200 includes a step 250, in which a sacrificial layer is formed over the dielectric layer and the metal material. The sacrificial layer is formed to have a planar surface, for example, a surface with a thickness variation less than about 80 angstroms across the entire surface. In some embodiments, the sacrificial layer is formed through a spin-on process. In these cases, the sacrificial layer contains at least one of: glass, organic polymer, or carbon doped silicon oxide. In other embodiments, the sacrificial layer is formed through a flowable chemical vapor deposition process. In these cases, the sacrificial layer contains at least one of: undoped silicate glass, phosphosilicate glass, or borophosphosilicate glass.

The method 200 includes a step 260, a second CMP process is performed to remove the sacrificial layer and portions of the dielectric layer and the metal material therebelow. The CMP process utilizes a slurry. The slurry is configured to have a substantially similar polishing selectivity between the sacrificial layer, the dielectric layer, and the metal material. In some embodiments, the slurry contains water, hydrogen peroxide, an abrasive material, and additives. The abrasive material may include at least one of: $SiO_2$, $Al_2O_3$, or $CeO_2$. The additives may include at least one of: a copper corrosion inhibitor, a copper chelator, a low-k rate suppressor, or a pH buffer.

It is understood that additional processes may be performed before, during, and/or after the steps 210-260. For reasons of simplicity, these additional steps are not discussed herein.

The embodiments of the present disclosure discussed above have advantages over existing methods. It is understood, however, that other embodiments may have different advantages, and that no particular advantage is required for all embodiments. One of the advantages is that a substantially planar wafer surface may be achieved in spite of the wafer having different pattern densities. The substantially planar surface may have a total surface variation of less than about 80 angstroms, which is much better than what can be achieved using existing planarization techniques. The methods of the present disclosure may be especially helpful for cutting edge semiconductor fabrication technologies, such as for the 15-nm technology node or other technology nodes beyond the 15-nm node, which may have greater planarity requirements than for older technology nodes.

Another advantage is that the embodiments disclosed herein are compatible with a Complementary Metal Oxide Semiconductor (CMOS) process flow. Thus, the embodiments disclosed herein can be implemented inexpensively and without causing significant disruptions for current fabrication process flows.

One aspect of the present disclosure involves a method of fabricating a semiconductor device. The method includes: performing a first planarization process to a wafer, wherein the wafer has an uneven topography after the first planarization process; forming a sacrificial layer over the wafer after the first planarization process, wherein the sacrificial layer is formed to have a substantially planar surface profile; and performing a second planarization process to the wafer, wherein the second planarization process removes the sacrificial layer and a portion of the wafer therebelow, and wherein the second planarization process is performed in a manner such that the substantially planar surface profile is transferred to the wafer after the second planarization process.

Another one aspect of the present disclosure involves a method of fabricating a semiconductor device. The method includes: forming an interconnect structure over a substrate, the interconnect structure including a plurality of conductive elements distributed in a manner such that the interconnect structure has non-uniform pattern densities; polishing an upper portion of the interconnect structure to remove at least a portion of the conductive elements, wherein the interconnect structure has a non-flat surface after the polishing; forming a sacrificial layer over the polished interconnect structure, the sacrificial layer having an upper surface with a flat profile; and removing the sacrificial layer and portions of the interconnect structure therebelow through a polishing process, the polishing process utilizing a slurry configured to cause substantially identical etching rates for the sacrificial layer and the portions of the interconnect structure therebelow, thereby preserving the flat profile of the upper surface of the sacrificial layer for a remaining portion of the interconnect structure.

Yet another one aspect of the present disclosure involves a method of fabricating a semiconductor device. The method includes: forming a dielectric layer over a substrate; forming a plurality of openings in the dielectric layer, the openings having varying distribution densities; filling the openings with a metal material; performing a first chemical-mechanical-polishing (CMP) process to remove portions of the metal material over the dielectric layer; thereafter forming a sacrificial layer having a planar surface over the dielectric layer and the metal material, the sacrificial layer being formed through one of: a spin-on process or a flowable chemical vapor deposition (FCVD) process; and performing a second CMP process to remove the sacrificial layer and portions of the dielectric layer and the metal material therebelow, the second CMP process using a slurry configured to have a substantially similar polishing selectivity between the sacrificial layer, the dielectric layer, and the metal material.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
providing a substrate having a structure formed thereon, wherein the structure has an uneven surface and contains a conductive material;
forming a layer directly on the uneven surface of the structure, wherein the layer has a planar surface across an entirety of the layer; and
polishing the layer and the structure therebelow, wherein the polishing includes using an etching chemical that is configured to have substantially similar etching rates for the layer and the structure, and wherein the polishing completely removes the layer and exposes at least a portion of the conductive material of the structure.

2. The method of claim 1, further comprising: before the forming of the layer, performing a planarization process to the structure formed on the substrate.

3. The method of claim 1, wherein the structure includes at least a conductive material and a dielectric material.

4. The method of claim 3, wherein the structure includes a plurality of interconnect layers.

5. The method of claim 1, wherein the etching rates are within a few percentage points of one another.

6. The method of claim 1, wherein:
the polishing comprises a chemical-mechanical-polishing (CMP) process; and
the etching chemical is a slurry used in the CMP process.

7. The method of claim 6, wherein the slurry contains at least water, hydrogen peroxide, an abrasive material, and an additive.

8. The method of claim 7, wherein:
the abrasive material includes silicon dioxide, aluminum oxide, cerium oxide, or combinations thereof; and
the additive includes a copper corrosion inhibitor, a copper chelator, a low-k rate suppressor, a pH buffer, or combinations thereof.

9. The method of claim 1, wherein the forming of the layer comprises a spin-on process or a flowable chemical vapor deposition (FCVD) process.

10. The method of claim 9, wherein the forming of the layer further comprises a baking process following the spin-on process and a curing process following the baking process.

11. The method of claim 1, wherein the forming of the layer comprises forming a layer that contains SiOF, polyimide, F-doped polyimide, SiOCH, $Si_xO_yC_zH_w$, carbon-doped silicon oxide, undoped silicate glass (USG), phosphosilicate glass (PSG), or borophosphosilicate glass (BPSG).

12. The method of claim 1, wherein the forming of the layer is performed such that the layer has a thickness variation of less than about 80 angstroms across an entirety of the layer.

13. A method, comprising:
providing a substrate having an interconnect structure formed thereon, wherein the interconnect structure includes a plurality of interconnect layers and has a first upper surface with a non-flat surface profile, and wherein the interconnect structure contains a conductive material;
forming a sacrificial layer directly on the upper surface of the interconnect structure, wherein the sacrificial layer has a second upper surface with a flat surface profile across an entirety of the second upper surface; and
performing a planarization process to the sacrificial layer and to the interconnect structure therebelow, wherein the planarization process completely removes the sacrificial layer and partially removes portions of the conductive material, the planarization preserving the flat surface profile at least in part by applying an etching chemical that etched away the interconnect structure and the sacrificial layer with substantially similar etching rates.

14. The method of claim 13, further comprising: before the forming of the sacrificial layer, polishing the interconnect structure.

15. The method of claim 13, wherein:
the planarization process comprises a chemical-mechanical-polishing (CMP) process; and
the etching chemical is a slurry used in the CMP process, the slurry containing at least water, hydrogen peroxide, an abrasive material, and additives.

16. The method of claim 15, wherein:
the abrasive material includes silicon dioxide, aluminum oxide, cerium oxide, or combinations thereof; and
the additives include a copper corrosion inhibitor, a copper chelator, a low-k rate suppressor, a pH buffer, or combinations thereof.

17. The method of claim 13, wherein the forming of the sacrificial layer comprises a spin-on process or a flowable chemical vapor deposition (FCVD) process.

18. The method of claim 13, wherein the forming of the sacrificial layer comprises forming a sacrificial layer that contains SiOF, polyimide, F-doped polyimide, SiOCH, $Si_xO_yC_zH_w$, carbon-doped silicon oxide, undoped silicate glass (USG), phosphosilicate glass (PSG), or borophosphosilicate glass (BPSG).

19. A method, comprising:
forming an interconnect structure over a substrate, wherein the interconnect structure includes a plurality of interconnect layers and contains at least a metal material and a dielectric material;
performing a first polishing process to the interconnect structure, wherein the first polishing process exposes at least some of the metal material;
thereafter forming, via a spin-on process or a flowable chemical vapor deposition (FCVD) process, a sacrificial layer over the interconnect structure, wherein at least some of the sacrificial layer is in physical contact with exposed surfaces of the metal material, and wherein the sacrificial layer has an upper surface that has a thickness variation of less than about 80 angstroms throughout; and
performing a second polishing process to the sacrificial layer and to the interconnect structure therebelow, wherein the second polishing process exposes at least a portion of the metal material, and wherein the second polishing process is performed using a slurry that contains at least water, hydrogen peroxide, an abrasive material, and additives;
wherein:
the abrasive material includes silicon dioxide, aluminum oxide, cerium oxide, or combinations thereof; and
the additives include a copper corrosion inhibitor, a copper chelator, a low-k rate suppressor, a pH buffer, or combinations thereof.

20. The method of claim 19, wherein the forming of the sacrificial layer comprises forming a sacrificial layer that contains SiOF, polyimide, F-doped polyimide, SiOCH, $Si_xO_yC_zH_w$, carbon-doped silicon oxide, undoped silicate glass (USG), phosphosilicate glass (PSG), or borophosphosilicate glass (BPSG).

* * * * *